(12) United States Patent
Takada

(10) Patent No.: US 8,552,602 B2
(45) Date of Patent: Oct. 8, 2013

(54) MOLDED MOTOR

(75) Inventor: Masayuki Takada, Aichi (JP)

(73) Assignee: Panasonic Corporation, Osaka (JP)

( * ) Notice: Subject to any disclaimer, the term of this patent is extended or adjusted under 35 U.S.C. 154(b) by 206 days.

(21) Appl. No.: 13/123,733

(22) PCT Filed: Oct. 26, 2009

(86) PCT No.: PCT/JP2009/005619
§ 371 (c)(1),
(2), (4) Date: Apr. 12, 2011

(87) PCT Pub. No.: WO2010/050165
PCT Pub. Date: May 6, 2010

(65) Prior Publication Data
US 2011/0193430 A1    Aug. 11, 2011

(30) Foreign Application Priority Data
Oct. 31, 2008   (JP) .................................. 2008-280923

(51) Int. Cl.
*H02K 1/04*   (2006.01)
(52) U.S. Cl.
USPC ............................................. 310/43; 310/71
(58) Field of Classification Search
USPC .................. 310/43, 71; 29/596–598
See application file for complete search history.

(56) References Cited

U.S. PATENT DOCUMENTS

| | | | | |
|---|---|---|---|---|
| 4,352,897 A | * | 10/1982 | Ogata et al. | 523/220 |
| 4,387,311 A | * | 6/1983 | Kobayashi et al. | 310/43 |
| 5,990,247 A | * | 11/1999 | Terada et al. | 525/415 |
| 2004/0119345 A1 | * | 6/2004 | Takano | 310/43 |
| 2005/0078561 A1 | * | 4/2005 | Endo et al. | 368/280 |
| 2006/0220474 A1 | * | 10/2006 | Yoshida | 310/43 |

FOREIGN PATENT DOCUMENTS

| JP | 11-054854 A | 2/1999 |
|---|---|---|
| JP | 11-054854 A | 2/1999 |
| JP | 11054854 A * | 2/1999 |
| JP | 2002-238198 A | 8/2002 |
| JP | P2002-238198 A | 8/2002 |
| JP | 2006-014490 A | 1/2006 |
| JP | 2007-008042 A | 1/2007 |
| JP | 2007-008042 A | 1/2007 |
| JP | 2007-287900 A | 11/2007 |
| JP | 2007-297900 A | 11/2007 |
| JP | 2008-138090 A | 6/2008 |
| JP | 2008-138090 A | 6/2008 |

OTHER PUBLICATIONS

JP 11054854 A machine translation Jan. 13, 2013.*
International Search Report for Application No. PCT/JP2009/005619, Jan. 19, 2010, Panasonic Corporation.

* cited by examiner

*Primary Examiner* — Tran Nguyen
*Assistant Examiner* — Leda Pham
(74) *Attorney, Agent, or Firm* — RatnerPrestia

(57) ABSTRACT

A molded motor including a stator including a housing formed by integrally molding an armature winding and a printed circuit board with resin containing a fibrous reinforcing material and filler; a magnet rotor rotatably disposed to face the stator; and a plurality of lead wires led out to outside. The printed circuit board is provided with a plurality of lands connecting the lead wires by soldering, and a round hole between the plurality of lands filled with the resin, and the reinforcing material is oriented in a board thickness direction of the printed circuit board.

15 Claims, 3 Drawing Sheets

MOLDED MOTOR

THIS APPLICATION IS A U.S. NATIONAL PHASE APPLICATION OF PCT INTERNATIONAL APPLICATION PCT/JP2009/005619.

TECHNICAL FIELD

The present invention relates to a molded motor.

BACKGROUND ART

Recently, molded motors to be mounted in electrical apparatuses such as a ventilator have been required to be small, thin and light with high quality maintained. Conventionally, as molded motors of this type, a configuration disclosed in Patent Document 1 has been known.

Hereinafter, the molded motor is described with reference to FIG. 4. FIG. 4 shows a structure of a printed circuit board to be mounted in a conventional molded motor.

As shown in FIG. 4, printed circuit board 111 is provided with oblong slits 114 between through holes 112 for lead wires. In molding, by pouring molded resin between slits 114, a molded motor in which insulation between through holes 112 is secured and a creepage distance therebetween is secured is achieved.

According to such a conventional molded motor, since the resin poured into oblong slit 114 flows in the longitudinal direction of slit 114, glass fibers contained in the resin are oriented along the direction. Therefore, when a mold shrinkage rate of resin is large or when the content of a mold release agent made of a metallic soap contained in the resin is large, the amount of glass fibers aligned in the board thickness direction of the printed circuit board is small due to stress concentration and tensile strength between the resin and the printed circuit board. As a result, peeling in an interface between the resin and the printed circuit board occurs.

Herein, the stress concentration occurs due to mold shrinkage at the time when resin is molded and solidified or due to the difference in the coefficient of linear expansion between the printed circuit board and the resin. Furthermore, the tensile strength between the resin and the printed circuit board occurs due to tension of the resin to a mold at the time when the resin is demolded from the mold.

When a molded motor is used in high-temperature and high-humidity space, tracking between through holes 112 may occur. Therefore, high-quality molded motors, in which resin is resistant to stress concentration due to mold shrinkage and the like and to tensile strength at the time of demolding and peeling in an interface between resin and a printed circuit board does not occur, are demanded.

CITATION LIST

Patent Literature

[Patent Literature 1] Japanese Patent Application Unexamined Publication No. 2007-287900

SUMMARY OF THE INVENTION

The present invention is a molded motor including: a stator including a housing formed by integrally molding an armature winding and a printed circuit board with resin containing a fibrous reinforcing material and filler; a magnet rotor rotatably disposed to face the stator; and a plurality of lead wires led out to the outside. The printed circuit board is provided with a plurality of lands connecting the lead wires by soldering, and a round hole between the plurality of lands filled with the resin, and the reinforcing material is oriented in a board thickness direction of the printed circuit board.

Most of the glass fibers in the resin filled in the round hole are oriented in the board thickness direction of the printed circuit board, so that they can be resistant to the stress concentration due to mold shrinkage and the like, and to tensile strength at the time of demolding. Therefore, the peeling in an interface between resin and a printed circuit board does not occur. Thus, tracking does not occur when the molded motor is used in high-temperature and high-humidity space.

DETAILED DESCRIPTION OF THE PREFERRED EMBODIMENTS

Hereinafter, an exemplary embodiment of the present invention is descried with reference to drawings.

Exemplary Embodiment

Figure 1:
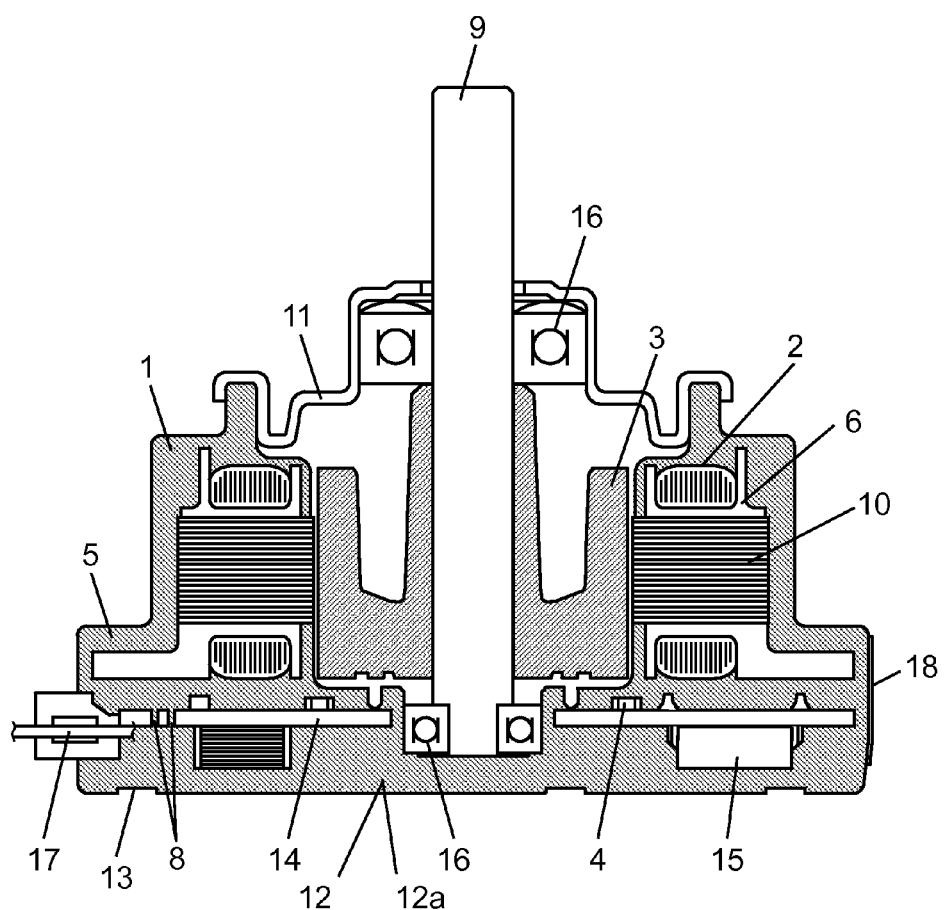
FIG. 1 is a sectional view showing a molded motor in accordance with an exemplary embodiment of the present invention.
Figure 2:
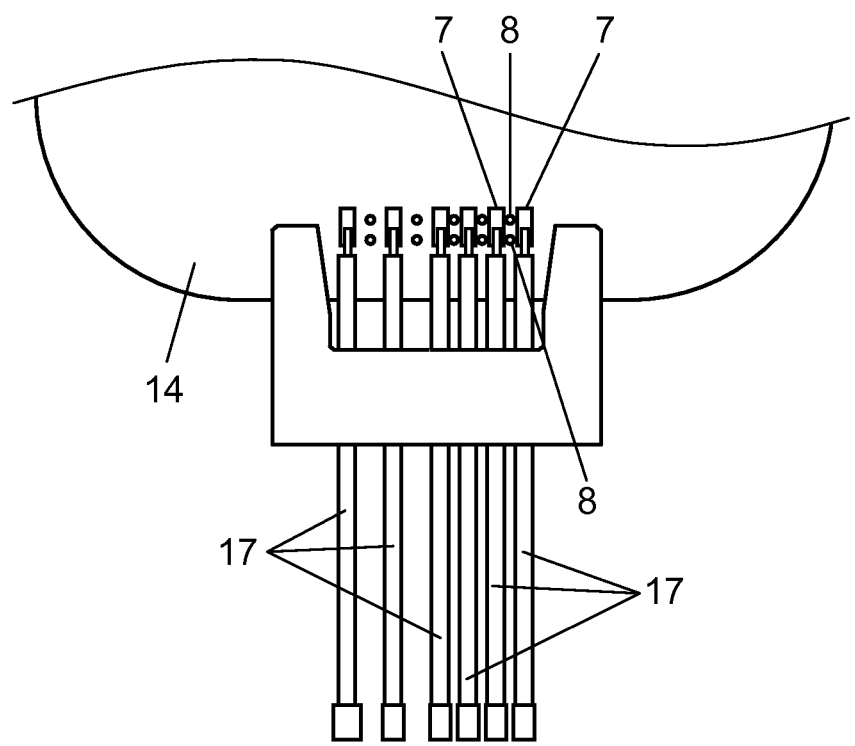
FIG. 2 shows a structure of a printed circuit board to be mounted in the molded motor.
Figure 3:
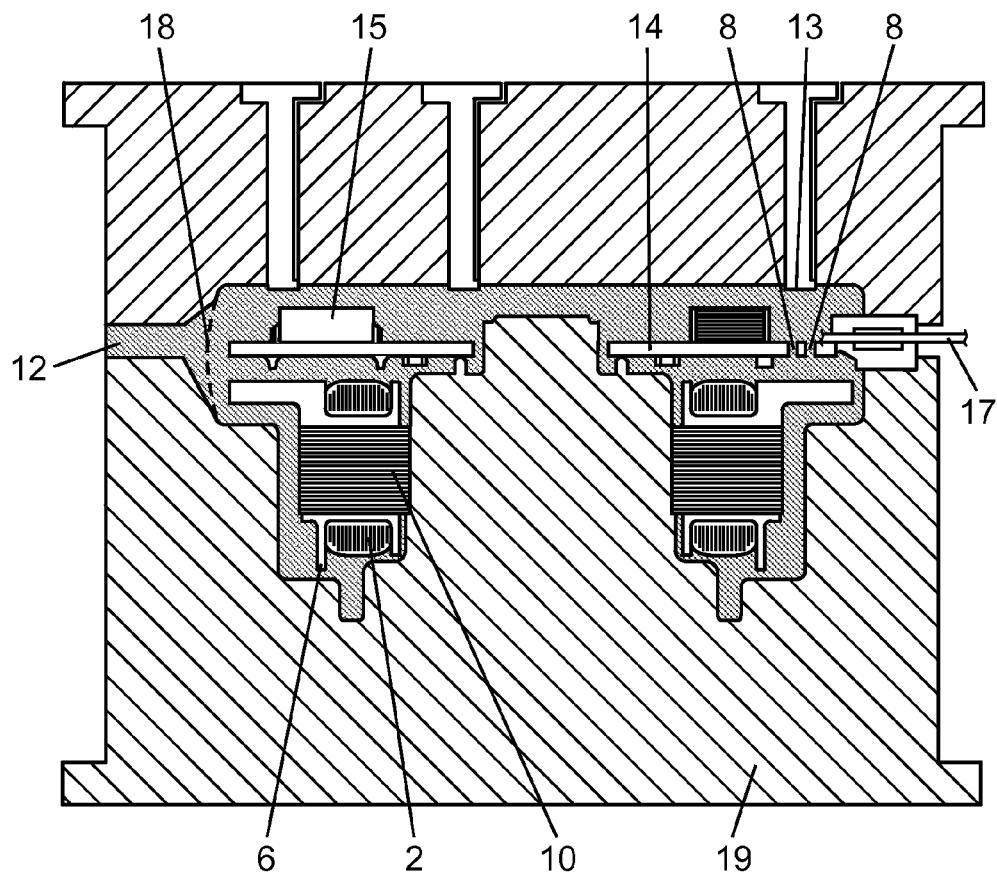
FIG. 3 is a sectional view showing a state in which the molded motor is molded.
Figure 4:
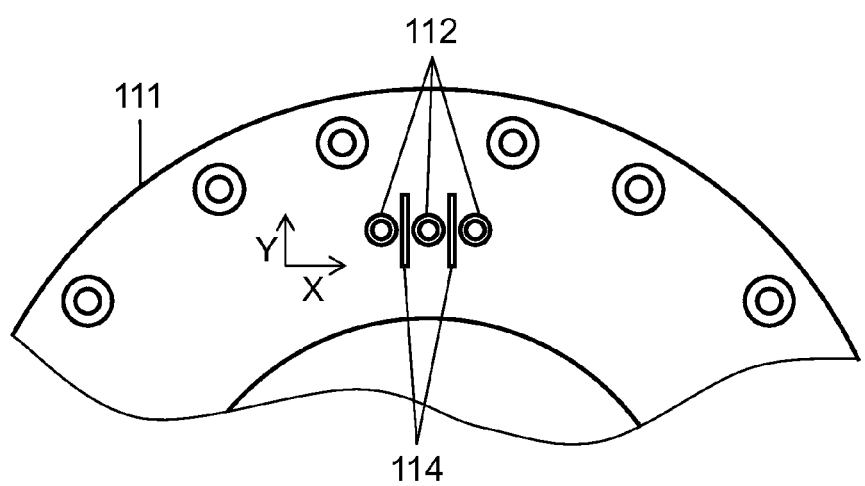
FIG. 4 is shows a structure of a printed circuit board to be mounted in a conventional molded motor.

FIG. 1 is a sectional view showing a molded motor in accordance with an exemplary embodiment of the present invention. FIG. 2 shows a structure of a printed circuit board to be mounted in the molded motor. FIG. 3 is a sectional view showing a state in which the molded motor is molded.

As shown in FIGS. 1 to 3, molded motor 1 includes stator iron core 10 around which armature winding 2 is wound via insulator 6. Herein, stator iron core 10 is formed by laminating thin steel plates such as silicon steel plates having a plurality of slots. Insulator 6 is formed of an insulating material.

Bracket 11 holds bearing 16. Magnet rotor 3 is formed by injection-molding a pole-oriented plastic magnet to be integrated with shaft 9. Furthermore, magnet rotor 3 is rotatably disposed at the inner side of stator iron core 10.

Hall element 4 senses a position of a magnetic pole of magnet rotor 3. Driving IC (Integrated Circuit) 15 incorporates a switching element. The switching element controls electric current running through to armature winding 2 based on an output signal from Hall element 4. Hall element 4, driving IC 15, and other electronic components are mounted on printed circuit board 14. Printed circuit board 14 is incorporated in molded motor 1. A plurality of lead wires 17 supply driving IC 15 and the like with a power source. Each of lead wires 17 is soldered to each of lands 7 provided on printed circuit board 14.

A plurality of round holes 8 are opened between lands 7, and aligned in the longitudinal direction of land 7. Stator iron core 10, insulator 6, armature winding 2, printed circuit board 14, and a part of lead wires 17, together with housing 12a, constitute stator 5. Herein, housing 12a is formed by integrally molding thermosetting resin 12 containing filler, a reinforcing material, and a shrinkage-reducing agent by using injection molding mold 19 by a screw molding machine (not shown).

Examples of the filler include aluminum hydroxide and calcium carbonate. Examples of the reinforcing material include glass fiber and needle wollastonite having a length of about 0.1 to 0.2 mm. Examples of the shrinkage-reducing agent include polystyrene for controlling the mold shrinkage rate. Examples of thermosetting resin 12 include unsaturated polyester containing a mold release agent made of a metallic soap, for example, calcium stearate, for controlling the demold characteristics after molding.

That is to say, molded motor 1 in accordance with the exemplary embodiment of the present invention includes stator 5, magnet rotor 3, a plurality of lead wires 17 led out to the outside, and printed circuit board 14 provided with a plurality of lands 7 to which lead wires 17 are to be soldered. Round holes 8 are opened between a plurality of lands 7. Round hole 8 is filled with thermosetting resin 12 so as to orient the reinforcing material in the board thickness direction of printed circuit board 14.

Herein, stator 5 includes housing 12a formed by integrally molding armature winding 2 and printed circuit board 14 with thermosetting resin 12. Thermosetting resin 12 contains a fibrous reinforcing material and filler. Furthermore, magnet rotor 3 is rotatably disposed to face the stator.

Herein, lead wire 17 is disposed in a position distant from gate 18, so that the filling rate of thermosetting resin 12 is made to be slow. Aluminum hydroxide as filler of thermosetting resin 12 has two types of particle size distributions. In the two types of the particle size distributions of aluminum hydroxide, the substantial distribution centers are about 1.5 μm and about 8 μm, respectively. The substantial distribution center of the particle size distribution of calcium carbonate is about 7 μm. Aluminum hydroxide occupies 56 wt. % and calcium carbonate occupies 11 wt. % with respect to the total amount of thermosetting resin 12, respectively.

Furthermore, the glass fibers include glass fibers having a length of 3 mm and glass fibers having a length of 1.5 mm. However, some glass fibers may be fractured into the length of about 0.5 mm. Each round hole 8 is filled with thermosetting resin 12. Short glass fibers such as fractured glass fibers and wollastonite are oriented in the board thickness direction of printed circuit board 14. Aluminum hydroxide having a fine particle diameter absorbing a large amount of ester resin is contained in the filler in abundant. Gas relief portion 13 is disposed in the vicinity of round hole 8 of housing 12a.

Such a molded motor 1 has round holes 8 opened between lands 7. Round hole 8 is filled with thermosetting resin 12. Most of glass fibers in thermosetting resin 12 are oriented in the board thickness direction of printed circuit board 14, thus reducing the mold shrinkage rate of thermosetting resin 12 of round hole 8 in the board thickness direction of printed circuit board 14. Therefore, resistance to stress concentration due to mold shrinkage or the like and to a tensile strength at the time of demolding are achieved, so that the peeling in an interface between thermosetting resin 12 and printed circuit board 14 does not occur. Therefore, it is possible to achieve high-quality molded motor 1 in which tracking does not occur even when molded motor 1 is used in high-temperature and high-humidity space.

Furthermore, since a plurality of round holes 8 that are opened between lands 7 are provided, glass fibers are oriented in the board thickness direction of printed circuit board 14, and the two sides of the surface of printed circuit board 14 are linked together in a plurality of portions. Therefore, proof stress with respect to the peeling strength in an interface between thermosetting resin 12 and printed circuit board 14 is increased. Thus, even if molded motor 1 is used in high-temperature and high-humidity space, tracking does not occur.

Furthermore, since a plurality of round holes 8 are aligned in the longitudinal direction of land 7, glass fibers are oriented in the board thickness direction of printed circuit board 14, and the two sides of the surface of printed circuit board 14 are linked together in a plurality of portions in the longitudinal direction of land 7. Therefore, proof stress with respect to the peeling strength in an interface between thermosetting resin 12 and printed circuit board 14 is further increased. Thus, even if molded motor 1 is used in high-temperature and high-humidity space, tracking does not occur.

Furthermore, the reinforcing material contained in thermosetting resin 12 includes glass fibers having two or more different types of lengths. Thus, since the fluidity of the short glass fiber is high, the amount of glass fibers to be oriented in the board thickness direction of printed circuit board 14 is reliably increased regardless of the position of round hole 8. That is to say, even if the position of round hole 8 is located in the flowing end, since the fluidity of short glass fiber is high, the amount of glass fibers to be oriented in the board thickness direction of printed circuit board 14 is increased reliably. Therefore, proof stress with respect to the peeling strength in an interface between thermosetting resin 12 and printed circuit board 14 is increased. Thus, even if molded motor 1 is used in high-temperature and high-humidity space, tracking does not occur.

Furthermore, thermosetting resin 12 contains needle crystal such as wollastonite having high fluidity. Since the fluidity of needle wollastonite is high, the amount of needle products to be oriented in the board thickness direction of printed circuit board 14 is reliably increased. Regardless of the position of round hole 8, the needle products are oriented in the board thickness direction of printed circuit board 14. Consequently, since the mold shrinkage rate of thermosetting resin 12 of round hole 8 in the board thickness direction of printed circuit board 14 is further reduced. Therefore, proof stress with respect to the peeling strength in an interface between thermosetting resin 12 and printed circuit board 14 is further increased. Thus, even if molded motor 1 is used in high-temperature and high-humidity space, tracking does not occur.

Furthermore, stator 5 is integrally molded by a screw injection molding machine. Reinforcing materials contained in thermosetting resin 12 are formed by fracturing resin to be short by a back pressure during metering in the injection molding machine. Since the fluidity of the fractured short glass fiber is high, regardless of the position of round hole 8, the amount of glass fibers to be oriented in the board thickness direction of printed circuit board 14 is increased reliably. Therefore, proof stress with respect to the peeling strength in an interface between thermosetting resin 12 and printed circuit board 14 is further increased. Thus, even if molded motor 1 is used in high-temperature and high-humidity space, tracking does not occur.

Furthermore, the filler contained in thermosetting resin 12 includes aluminum hydroxide and calcium carbonate. The percent by weight of aluminum hydroxide absorbing a large amount of resin is made to be higher than the percent by weight of calcium carbonate having a smaller amount of resin absorbed. That is to say, since the fluidity of thermosetting resin 12 is reduced. Therefore, contamination of air, which is generated at the time when the flowing direction is changed in, for example, a portion in which the shape is changed when the flow of thermosetting resin 12 is high, is suppressed.

Consequently, the occurrence of voids in round hole 8 is suppressed, and the amount of filler such as an inorganic compound to be filled in round hole 8 is increased. Therefore, proof stress with respect to the peeling strength in an interface between thermosetting resin 12 and printed circuit board 14 is further increased. Thus, even if molded motor 1 is used in high-temperature and high-humidity space, tracking does not occur.

Furthermore, the filler has three types of more of particle size distributions. Thus, filler with a rough particle diameter has high fluidity, and filler with a fine particle diameter has low fluidity. Consequently, the filling speed with respect to regions requiring rapid filling and regions requiring slow filling, for example, round hole 8 can be adjusted. Therefore, it is possible to suppress non-filling due to slow filling speed or occurrence of voids due to high filling rate. Thus, the occurrence of voids in the vicinity of round hole 8 is suppressed, and the amount of filler as an inorganic compound to be filled in round hole 8 is increased. As a result, proof stress with respect to the peeling strength in an interface between thermosetting resin 12 and printed circuit board 14 is further increased, and high quality molded motor 1 can be obtained.

Furthermore, since the filler having the particle size distribution having the finest particle diameter is aluminum hydroxide, the filling rate in the vicinity of round hole 8 is further slower. Therefore, the contamination of air is suppressed and shrinkage at the time of molding and solidification is reduced, and proof stress with respect to the peeling strength in an interface between thermosetting resin 12 and printed circuit board 14 is further increased. Thus, even if molded motor 1 is used in high-temperature and high-humidity space, tracking does not occur.

Furthermore, in the vicinity of round hole 8 of housing 12a, gas relief portion 13 into which gas generated at the time of molding is allowed to escape is provided. With this configuration, thermosetting resin 12 injected from gate 18 of injection molding mold 19 is filled while it extrudes the contained gasified component such as styrene to the outside of a mold for injection molding 19, thus reducing the filling rate and the pressure in the vicinity of round hole 8. Therefore, the contamination of air is suppressed, the amount of filler as an inorganic compound to be filled in round hole 8 is increased, and the shrinkage at the time of molding and solidification is reduced. Therefore, proof stress with respect to the peeling strength in an interface between thermosetting resin 12 and printed circuit board 14 is further increased. Thus, even if molded motor 1 is used in high-temperature and high-humidity space, tracking does not occur.

INDUSTRIAL APPLICABILITY

As mentioned above, a molded motor of the present invention can be mounted in electrical apparatuses, for example, a ventilator, a water heater, air conditioning unit such as an air conditioner, an air cleaner, a dehumidifier, dryer, a fan filter unit, and the like, which are required to be small, thin and light with high quality maintained for a long time.

REFERENCE MARKS IN THE DRAWINGS

1 molded motor
2 armature winding
3 magnet rotor
4 Hall element
5 stator
6 insulator
7 land
8 round hole
9 shaft
10 stator iron core
11 bracket
12 thermosetting resin
12a housing
13 gas relief portion
14 printed circuit board
15 driving IC
16 bearing
17 lead wire
18 gate
19 injection molding mold

The invention claimed is:

1. A molded motor comprising:
   a stator including a housing formed by integrally molding an armature winding and a printed circuit board with resin containing a fibrous reinforcing material and filler;
   a magnet rotor rotatably disposed to face the stator; and
   a plurality of lead wires led out to outside,
   wherein the printed circuit board is provided with a plurality of lands connecting the lead wires by soldering, and a round hole is disposed between the plurality of lands, and the round hole is filled with the resin, and
   the reinforcing material is oriented in a board thickness direction of the printed circuit board.

2. The molded motor of claim 1,
   wherein a plurality of round holes including the round hole are disposed between the plurality of lands.

3. The molded motor of claim 2,
   wherein the plurality of round holes are aligned in a longitudinal direction of each of the plurality of the lands which has a substantially rectangular shape.

4. The molded motor of claim 1,
   wherein the reinforcing material includes fibers having two or more different lengths.

5. The molded motor of claim 1,
   wherein the resin contains a needle crystal of wollastonite.

6. The molded motor of claim 1,
   wherein the stator is molded by a screw injection molding machine, and the reinforcing material is fractured by a back pressure during metering in the injection molding machine.

7. The molded motor of claim 1,
   wherein the filler comprises aluminum hydroxide and calcium carbonate, and a percent by weight of aluminum hydroxide is made to be higher than a percent by weight of calcium carbonate.

8. The molded motor of claim 7,
   wherein the filler has three or more types of particle size distributions.

9. The molded motor of claim 8,
   wherein the filler having a finest particle size distribution is aluminum hydroxide.

10. The molded motor of claim 6,
    wherein a gas relief portion is provided in the vicinity of the round hole, for allowing gas generated at the time of molding by the injection molding machine to escape.

11. The molded motor of claim 2,
    wherein the reinforcing material includes fibers having two or more different lengths.

12. The molded motor of claim 3,
    wherein the reinforcing material includes fibers having two or more different lengths.

13. The molded motor of claim 1, wherein said resin includes glass fibers, and said glass fibers in said round hole are oriented in the board thickness direction of the printed circuit board.

14. The molded motor of claim 1,
wherein the round hole is disposed between one land and another land of the plurality of lands, the one land is adjacent to the another land.

15. The molded motor of claim 14,
wherein a plurality of round holes including the round hole are disposed between the one land and the another land of the plurality of lands.

* * * * *